(12) United States Patent
Nakatani

(10) Patent No.: US 11,837,466 B2
(45) Date of Patent: *Dec. 5, 2023

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: KOKUSAI ELECTRIC CORPORATION, Tokyo (JP)

(72) Inventor: Kimihiko Nakatani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 161 days.

This patent is subject to a terminal disclaimer.

(21) Appl. No.: 17/396,262

(22) Filed: Aug. 6, 2021

(65) Prior Publication Data
US 2021/0366706 A1   Nov. 25, 2021

Related U.S. Application Data

(63) Continuation of application No. 16/817,563, filed on Mar. 12, 2020, now Pat. No. 11,158,501.

(30) Foreign Application Priority Data

Mar. 18, 2019 (JP) ................. 2019-049691

(51) Int. Cl.
| | | |
|---|---|---|
| *H01L 21/02* | (2006.01) | |
| *C23C 16/04* | (2006.01) | |
| *C23C 16/34* | (2006.01) | |

(52) U.S. Cl.
CPC ........ *H01L 21/02312* (2013.01); *C23C 16/04* (2013.01); *C23C 16/345* (2013.01);
(Continued)

(58) Field of Classification Search
None
See application file for complete search history.

(56) References Cited

U.S. PATENT DOCUMENTS 11,158,501 B2 * 10/2021 Nakatani ................. C23C 16/04
2017/0278705 A1   9/2017 Murakami et al.
(Continued)

FOREIGN PATENT DOCUMENTS

| JP | 2013-243193 A | 12/2013 |
|---|---|---|
| JP | 2017-174919 A | 9/2017 |

(Continued)

OTHER PUBLICATIONS

Taiwan Office Action dated Jun. 28, 2022 for Taiwan Patent Application No. 110128453.
(Continued)

*Primary Examiner* — Asok K Sarkar
(74) *Attorney, Agent, or Firm* — Volpe Koenig (57) ABSTRACT

There is provided a technique that includes: (a) supplying a silicon- and ligand-containing gas to a substrate having a surface on a first base and second base are exposed to adsorb silicon contained in the silicon- and ligand-containing gas on a surface of one of the first and second base; (b) supplying a fluorine-containing gas to the substrate after the silicon is absorbed, to cause the silicon to react with the fluorine-containing gas to modify the surface to be F-terminated; and (c) supplying a film-forming gas to the substrate after the surface is modified, to thereby form a film on a surface of the other of the first base and the second base, which is different from the one of the first base and the second base.

22 Claims, 6 Drawing Sheets

(52) U.S. Cl.
CPC .... *H01L 21/0217* (2013.01); *H01L 21/02211* (2013.01); *H01L 21/02271* (2013.01)

(56) References Cited

U.S. PATENT DOCUMENTS

| | | |
|---|---|---|
| 2017/0287778 A1 | 10/2017 | Okada et al. |
| 2017/0323778 A1 | 11/2017 | Godet et al. |
| 2018/0010247 A1 | 1/2018 | Niskanen et al. |
| 2018/0080121 A1 | 3/2018 | Ongrie et al. |
| 2018/0315840 A1 | 11/2018 | Chui et al. |
| 2018/0337040 A1 | 11/2018 | Kao et al. |
| 2019/0055643 A1 | 2/2019 | Longrie et al. |
| 2019/0341476 A1 | 11/2019 | Chui et al. |
| 2020/0219718 A1 | 7/2020 | Smith et al. |
| 2020/0224331 A1 | 7/2020 | Niskanen et al. |
| 2020/0291511 A1 | 9/2020 | Ongrie et al. |
| 2020/0312653 A1 | 10/2020 | Fredrickson et al. |
| 2020/0354834 A1 | 11/2020 | De Silva et al. |
| 2020/0402789 A1 | 12/2020 | Osaki et al. |
| 2021/0035801 A1 | 2/2021 | Waseda et al. |
| 2021/0043448 A1 | 2/2021 | Li et al. |
| 2021/0098258 A1 | 4/2021 | Degai et al. |
| 2021/0118684 A1 | 4/2021 | Todd |
| 2021/0129179 A1 | 5/2021 | Chen et al. |

FOREIGN PATENT DOCUMENTS

| | | |
|---|---|---|
| KR | 2017-0138954 A | 12/2017 |
| KR | 2018-0006332 A | 1/2018 |
| KR | 2018-0120062 A | 11/2018 |

OTHER PUBLICATIONS

Korean Office Action dated Feb. 3, 2021 for Korean Patent Application No. 10-2020-0029475.

Taiwanese Office Action dated Sep. 11, 2020 for Taiwanese Patent Application No. 109100274.

* cited by examiner

METHOD OF MANUFACTURING SEMICONDUCTOR DEVICE, SUBSTRATE PROCESSING METHOD, SUBSTRATE PROCESSING APPARATUS, AND RECORDING MEDIUM

CROSS-REFERENCE TO RELATED APPLICATION

This application is a Continuation Application based on U.S. patent application Ser. No. 16/817,563, filed on Mar. 12, 2020 which claims benefit from Japanese Patent Application No. 2019-049691, filed on Mar. 18, 2019, the entire contents of which are incorporated herein by reference in their entireties.

TECHNICAL FIELD

The present disclosure relates to a method of manufacturing a semiconductor device, a substrate processing apparatus, and a recording medium.

BACKGROUND

In the related art, as a process of manufacturing a semiconductor device, a process of selectively growing and forming a film on the surface of a specific one of a plurality of types of bases exposed on the surface of a substrate (hereinafter, this process is also referred to as selective growth or selective film formation) is often carried out.

SUMMARY

Some embodiments of the present disclosure provide a technique capable of increasing the selectivity in the above-mentioned selective growth.

According to an embodiment of the present disclosure, there is provided a technique that includes: (a) supplying an aminosilane-based gas to a substrate having a surface on which a first base and a second base are exposed, to thereby adsorb silicon contained in the aminosilane-based gas on a surface of one of the first base and the second base; (b) supplying a fluorine-containing gas to the substrate after the silicon is adsorbed on the surface of the one of the first base and the second base, to thereby react the silicon adsorbed on the surface of the one of the first base and the second base with the fluorine-containing gas to modify the surface of the one of the first base and the second base; and (c) supplying a film-forming gas to the substrate after the surface of the one of the first base and the second base is modified, to thereby form a film on a surface of the other of the first base and the second base, which is different from the one of the first base and the second base.

DETAILED DESCRIPTION

An Embodiment of the Present Disclosure

An embodiment of the present disclosure will be now mainly described with reference to FIGS. 1 to 4.

(1) Configuration of Substrate Processing Apparatus

Figure 1:
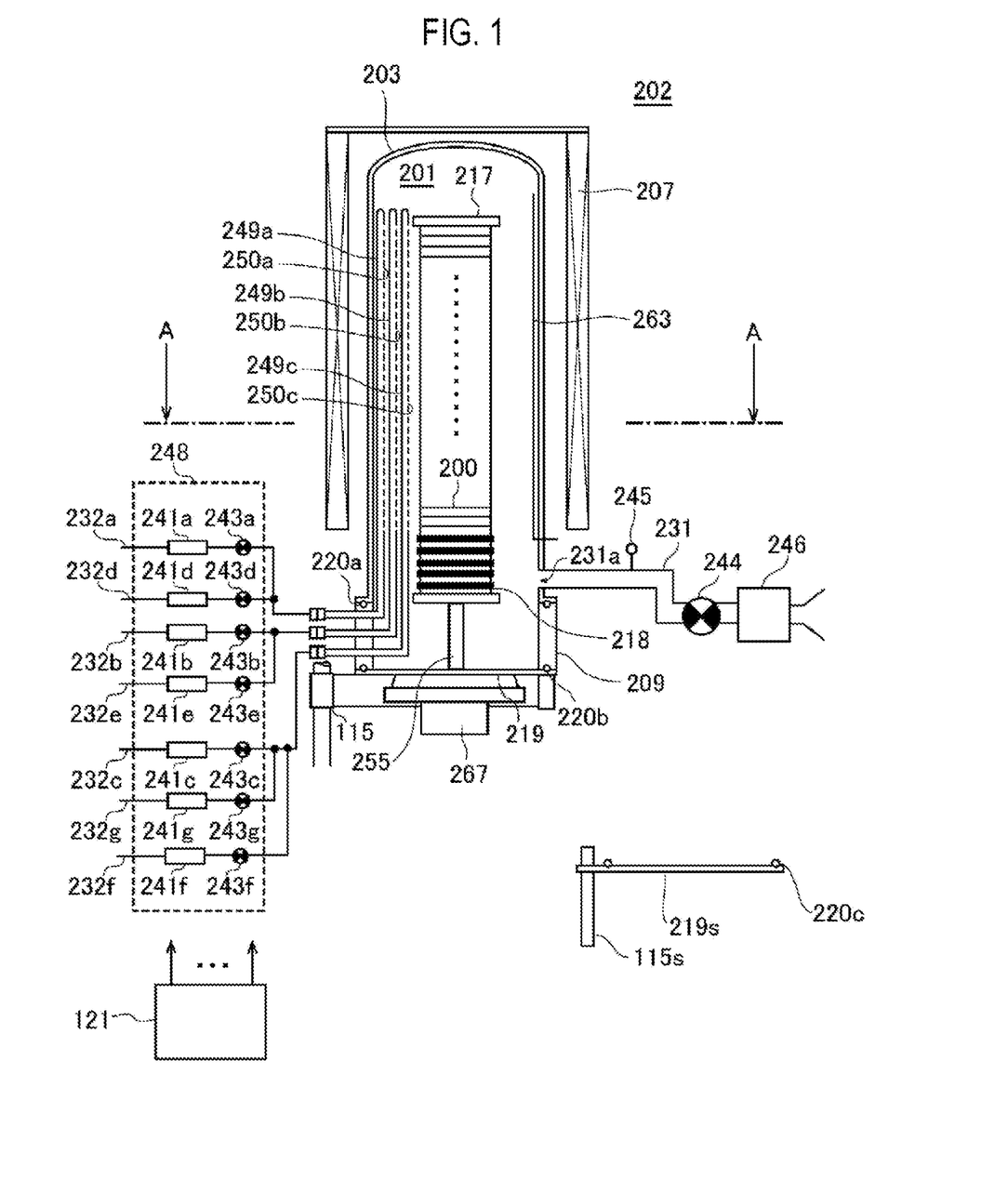
FIG. 1 is a schematic configuration view of a vertical process furnace of a substrate processing apparatus suitably used in an embodiment of the present disclosure, in which a portion of the process furnace 202 is shown in a vertical cross section.

As illustrated in FIG. 1, a process furnace 202 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$), silicon carbide (SiC) or the like, and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS) or the like, and has a cylindrical shape with both of its upper and lower ends opened. The upper end portion of the manifold 209 engages with the lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A processing container (reaction container) is mainly constituted by the reaction tube 203 and the manifold 209. A process chamber 201 is formed in a hollow cylindrical portion of the processing container. The process chamber 201 is configured to accommodate a plurality of wafers 200 as substrates. Processing on the wafers 200 is performed in the process chamber 201.

Nozzles 249a to 249c as first to third supply parts are respectively installed in the process chamber 201 so as to penetrate a sidewall of the manifold 209. The nozzles 249a to 249c are also called first to third nozzles, respectively. The nozzles 249a to 249c are made of, for example, a heat resistant material such as quartz, SiC or the like. Gas supply pipes 232a to 232c are connected to the nozzles 249a to 249c, respectively. The nozzles 249a to 249c are different nozzles, and each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c, respectively, sequentially from the upstream side of gas flow. Gas supply pipes 232d and 232e are connected to the gas supply pipes 232a and 232b at the downstream side of the valves 243a and 243b, respectively. Gas supply pipes 232f and 232g are respectively connected to the gas supply pipe 232c at the downstream side of the valve 243c. MFCs 241d to 241g and valves 243d to 243g are respectively installed at the gas supply pipes 232d to 232g, respectively, sequentially from the upstream side of gas flow. The gas supply pipes 232a to 232g are made of, for example, a metal material such as SUS or the like.

Figure 2:
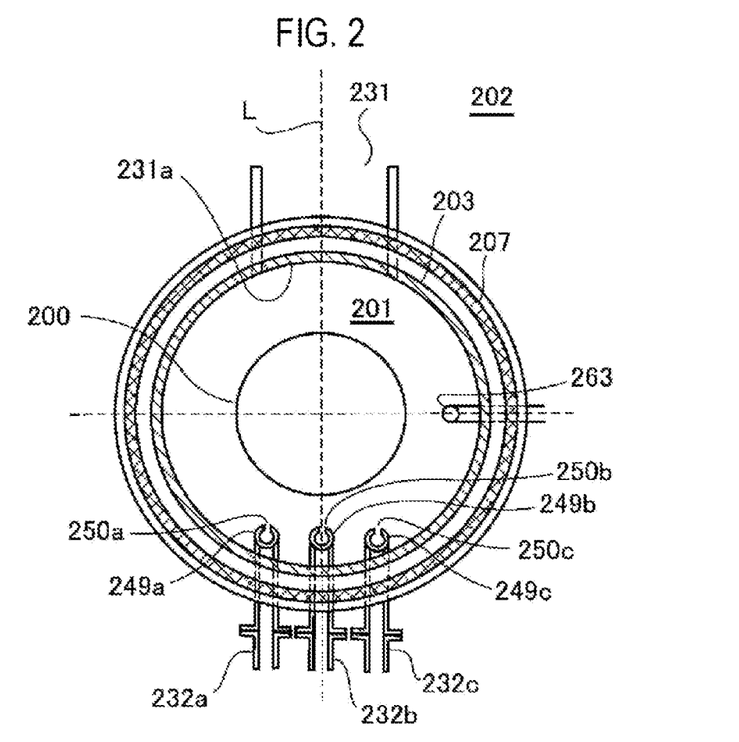
FIG. 2 is a schematic configuration view of a vertical process furnace of a substrate processing apparatus suitably used in an embodiment of the present disclosure, in which a portion of the process furnace 202 is shown in a cross section taken along line A-A in FIG. 1.

As illustrated in FIG. 2, each of the nozzles 249a to 249c is installed in an annular space (in a plane view) between an inner wall of the reaction tube 203 and the wafers 200 so as to extend upward along an arrangement direction of the wafers 200 from a lower portion of the inner wall of the reaction tube 203 to an upper portion thereof. Specifically, each of the nozzles 249a to 249c is installed in a region horizontally surrounding a wafer arrangement region in which the wafers 200 are arranged at a lateral side of the wafer arrangement region, along the wafer arrangement region. In the plane view, the nozzle 249b is disposed so as to face an exhaust port 231a to be described later in a straight line with the centers of the wafers 200 loaded into the process chamber 201, which are interposed therebetween. The nozzles 249a and 249c are disposed so that a straight line L passing through the centers of the nozzle 249b and the exhaust port 231a is sandwiched from both sides along the inner wall of the reaction tube 203 (an outer peripheral portion of the wafers 200). The straight line L is also a straight line passing through the centers of the nozzle 249b and the wafers 200. That is, it can be said that the nozzle 249c is installed at the opposite side of the nozzle 249a with the straight line L interposed therebetween. The nozzles 249a and 249c are disposed to be in line symmetry with the straight line L as an axis of symmetry. Gas supply holes 250a to 250c for supplying a gas are formed on side surfaces of the nozzles 249a to 249c, respectively. Each of the gas supply holes 250a to 250c is opened to oppose (face) the exhaust port 231a in the plane view to allow the gas to be supplied toward the wafers 200. A plurality of gas supply holes 250a to 250c may be formed from a lower portion of the reaction tube 203 to an upper portion thereof.

A gas containing silicon (Si) as a main element constituting films formed on the wafers 200 and a halogen element, that is, a halosilane-based gas, is supplied from the gas supply pipe 232a into the process chamber 201 via the MFC 241a, the valve 243a and the nozzle 249a. The halosilane-based gas acts as a film-forming gas, that is, a Si source (precursor gas). The halogen element includes chlorine (Cl), fluorine (F), bromine (Br), iodine (I) and the like. An example of the halosilane-based gas may include a chlorosilane-based gas containing Si and Cl, for example, a silicon tetrachloride ($SiCl_4$) gas.

A fluorine-containing gas is supplied from the gas supply pipe 232b into the process chamber 201 via the MFC 241b, the valve 243b and the nozzle 249b. An example of the fluorine-containing gas may include a fluorine ($F_2$) gas.

A hydrogen nitride-based gas, which is nitrogen (N)-containing gas, is supplied from the gas supply pipe 232c into the process chamber 201 via the MFC 241c, the valve 243c and the nozzle 249c. The hydrogen nitride-based gas acts as a film-forming gas, that is, an N source (nitriding gas or nitriding agent). An example of the hydrogen nitride-based gas may include an ammonia ($NH_3$) gas.

An aminosilane-based gas, which is a gas containing Si and an amino group, is supplied from the gas supply pipe 232g into the process chamber 201 via the MFC 241g, the valve 243g, the gas supply pipe 232c and the nozzle 249c.

An example of the aminosilane-based gas may include a monoaminosilane ($SiH_3R$) gas which is a precursor containing one amino group (in one molecule) in its composition formula. Here, R represents an amino group in which one or two hydrocarbon groups containing one or more C atoms are coordinated to one N atom (wherein one or both of H of the amino group represented by $NH_2$ are substituted by a hydrocarbon group containing one or more C atoms). When two hydrocarbon groups constituting a part of the amino group are coordinated to one N, the two hydrocarbon groups may be the same hydrocarbon group or different hydrocarbon groups. Further, the hydrocarbon group may include an unsaturated bond such as a double bond or a triple bond. Further, the amino group may have a cyclic structure. Since the amino group is bonded to Si, which is a central atom of the $SiH_3R$ molecule, this amino group is also called a ligand (ligand) or an amino ligand.

Examples of the $SiH_3R$ gas may include an ethylmethylaminosilane ($SiH_3[N(CH_3)(C_2H_5)]$) gas, a dimethylaminosilane ($SiH_3[N(CH_3)_2]$) gas, a diisopropylaminosilane ($SiH_3[N(C_3H_7)_2]$) gas, a disecondarybutylaminosilane ($SiH_3[H(C_4H_9)_2]$) gas, a dimethylpiperidinosilane ($SiH_3[NC_5H_8(CH_3)_2]$) gas and a diethylpiperidinosilane ($SiH_3[NC_5H_8(C_2H_5)_2]$) gas.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c and the nozzles 249a to 249c, respectively. The $N_2$ gas acts as a purge gas, a carrier gas, a dilution gas or the like.

A film-forming gas supply system (precursor gas supply system or reaction gas supply system) mainly includes the gas supply pipes 232a and 232c, the MFC 241a and 241c and the valves 243a and 243c. An aminosilane-based gas supply system mainly includes the gas supply pipe 232g, the MFC 241g and the valve 243g. A fluorine-containing gas supply system mainly includes the gas supply pipe 232b, the MFC 241b and the valve 243b. An inert gas supply system mainly includes the gas supply pipes 232d to 232f, the MFCs 241d to 241f and the valves 243d to 243f.

One or all of the above-described various supply systems may be configured as an integrated-type supply system 248 in which the valves 243a to 243g, the MFCs 241a to 241g and so on are integrated. The integrated-type supply system 248 is connected to each of the gas supply pipes 232a to 232g. In addition, the integrated-type supply system 248 may be configured such that operations of supplying various gases into the gas supply pipes 232a to 232g (that is, an opening/closing operation of the valves 243a to 243g, a flow rate adjustment operation by the MFCs 241a to 2412, and the like) are controlled by a controller 121 which will be described later. The integrated-type supply system 248 is configured as an integral type or detachable-type integrated unit, and may be attached to and detached from the gas supply pipes 232a to 232g and the like on an integrated unit basis, so that maintenance, replacement, extension etc. of the integrated-type supply system 248 can be performed on an integrated unit basis.

The exhaust port 231a for exhausting an internal atmosphere of the process chamber 201 is installed below the sidewall of the reaction tube 203. As illustrated in FIG. 2, in the plane view, the exhaust port 231a is installed at a position opposing (facing) the nozzles 249a to 249c (the gas supply holes 250a to 250c) with the wafers 200 interposed therebetween. The exhaust port 231a may be installed from a lower portion of the sidewall of the reaction tube 203 to an upper portion thereof, that is, along the wafer arrangement region. An exhaust pipe 231 is connected to the exhaust port 231a. A vacuum pump 246 as a vacuum exhaust device is connected to the exhaust pipe 231 via a pressure sensor 245, which is a pressure detector (pressure detecting part) for detecting the internal pressure of the process chamber 201, and an auto pressure controller (APC) valve 244, which is a pressure regulator (pressure adjustment part). The APC valve 244 is configured to perform or stop a vacuum exhausting operation in the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244 and the pressure sensor 245. The exhaust system may include the vacuum pump 246.

A seal cap 219, which serves as a furnace opening cover configured to hermetically seal a lower end opening of the manifold 209, is installed under the manifold 209. The seal cap 219 is made of, for example, a metal material such as stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is provided under the seal cap 219. A rotary shaft 255 of the rotation mechanism 267 is connected to the boat 217 through the seal cap 219. The rotation mechanism 267 is configured to rotate the wafers 200 by rotating the boat 217. The seal cap 219 is configured to be vertically moved up or down by a boat elevator 115 which is an elevating mechanism provided outside the reaction tube 203. The boat elevator 115 is configured as a transfer device (transfer mechanism) which loads/unloads (transfers) the wafers 200 into/out of the process chamber 201 by moving the seal cap 219 up or down. A shutter 219s, which serves as a furnace opening cover configured to hermetically seal a lower end opening of the manifold 209 in a state where the seal cap 219 is lowered and the boat 217 is unloaded from the process chamber 201, is installed under the manifold 209. The shutter 219s is made of, for example, a metal material such as stainless steel (SUS) or the like, and is formed in a disc shape. An O-ring 220c, which is a seal member making contact with the lower end portion of the manifold 209, is installed on an upper surface of the shutter 219s. The opening/closing operation (such as elevation operation, rotation operation or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is provided in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

Figure 3:
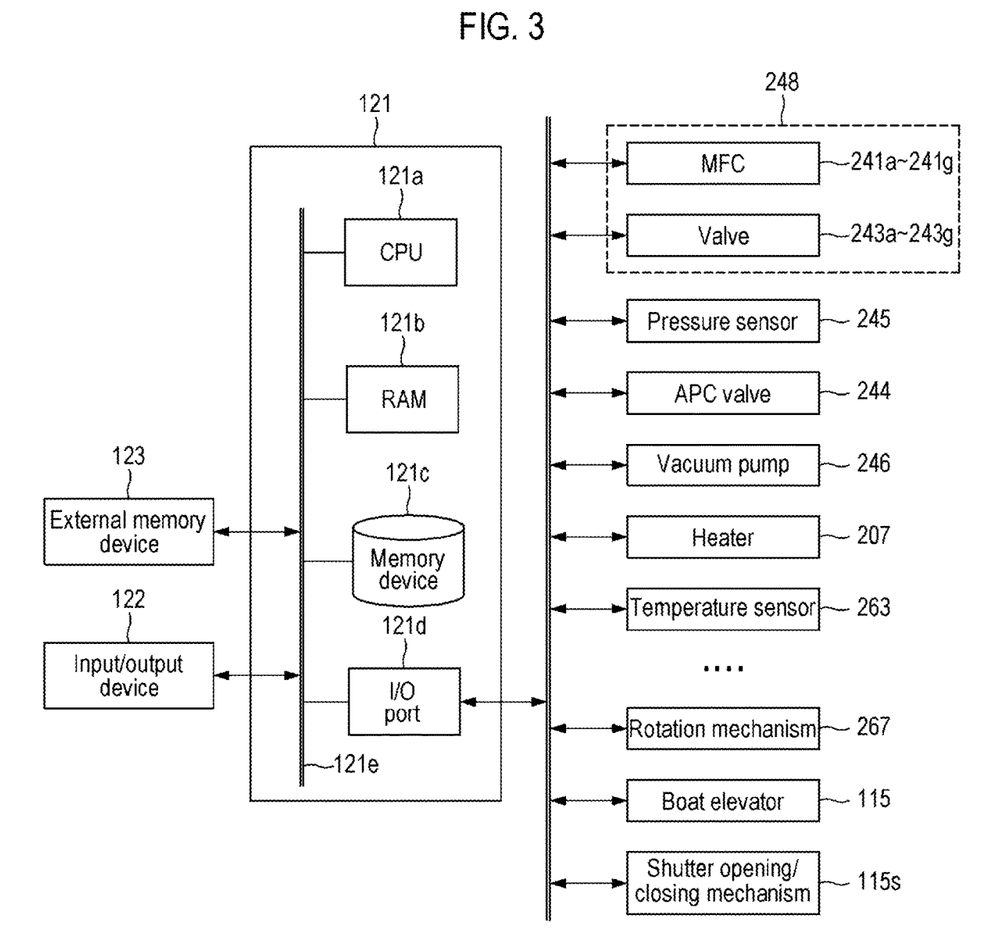
FIG. 3 is a schematic configuration diagram of a controller 121 of a substrate processing apparatus suitably used in an embodiment of the present disclosure, in which a control system of the controller 121 is shown in a block diagram.

As illustrated in FIG. 3, a controller 121, which is a control part (control means), may be configured as a computer including a central processing unit (CPU) 121a, a random access memory (RAM) 121b, a memory device 121c and an I/O port 121d. The RAM 121b, the memory device 121c and the I/O port 121d are configured to be able to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD) or the like. A control program for controlling operations of a substrate processing apparatus, a process recipe in which sequences and conditions of substrate processing to be described later are written, etc. are readably stored in the memory device 121c. The process recipe functions as a program for causing the controller 121 to execute each sequence in the substrate processing, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121b is configured as a memory area (work area) in which a program or data read by the CPU 121a is temporarily stored.

The I/O port 121d is connected to the MFCs 241a to 241g, the valves 243a to 243g, the pressure sensor 245, the APC valve 244, the vacuum pump 246, the temperature sensor 263, the heater 207, the rotation mechanism 267, the boat elevator 115, the shutter opening/closing mechanism 115s and so on.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjusting operation of various kinds of gases by the MFCs 241a to 241g, the opening/closing operation of the valves 243a to 243g, the opening/closing operation of the APC valve 244, the pressure adjusting operation performed by the APC valve 244 based on the pressure sensor 245, the actuating and stopping operation of the vacuum pump 246, the temperature adjusting operation performed by the heater 207 based on the temperature sensor 263, the operation of rotating the boat 217 with the rotation mechanism 267 and adjusting a rotational speed of the boat 217, the operation of moving the boat 217 up and down by the boat elevator 115, the opening/closing operation of the shutter 219s by the shutter opening/closing mechanism 115s, and so on, according to contents of the read recipe.

The controller 121 may be configured by installing, on the computer, the aforementioned program stored in an external memory device 123. Examples of the external memory device 123 may include a magnetic disk such as an HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and/or the external memory device 123 may be generally and simply referred to as a "recording medium." When the term "recording medium" is used herein, it may indicate a case of including the memory device 121c only, a case of including the external memory device 123 only, or a case of including both the memory device 121c and the external memory device 123. Furthermore, the program may be provided to the computer using communication means such as the Internet or a dedicated line, instead of using the external memory device 123.

(2) Substrate Processing Process

As one of processes of manufacturing a semiconductor device process using the above-described substrate processing apparatus, an example of processing sequence of selective growth (selective film formation) for selectively growing and forming a film on a surface of a specific one of a plurality of types of bases exposed on the surface of a wafer 200 as a substrate will be described mainly with reference to FIGS. 4 and 5A to 5E. In the following descriptions, the operations of the respective parts constituting the substrate processing apparatus are controlled by the controller 121.

Figure 4:
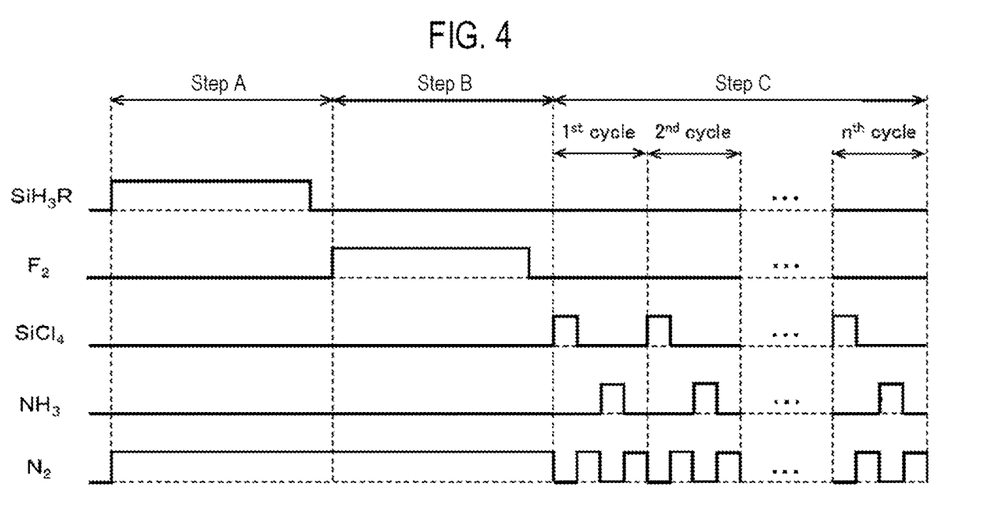
FIG. 4 is a diagram showing a processing sequence in selective growth according to an embodiment of the present disclosure.

The processing sequence illustrated in FIG. 4 includes a step A of supplying a $SiH_3R$ gas as an aminosilane-based gas to a wafer 200 on which a first base (base 200a) including a silicon oxide film (SiO film) and a second base (base 200b) including a silicon nitride film (SiN film) are exposed, to thereby adsorb Si contained in the $SiH_3R$ gas on a surface of one (here, the base 200a) of the bases 200a and 200b;

a step B of supplying a $F_2$ gas as a fluorine-containing gas to the wafer 200 after the Si is adsorbed on the surface of the base 200a, to thereby react the Si adsorbed on the surface of the base 200a with the $F_2$ gas to modify the surface of the base 200a; and a step C of supplying an $SiCl_4$ gas and an $NH_3$ gas as film-forming gases to the wafer 200 after the surface of the base 200a is modified, to thereby form an SiN film, which is a film containing Si and N, on the surface of the other base (here, the base 200b) different from the one base of the base 200a and the base 200b.

FIG. 4 shows a case where, in the step C, a cycle of non-simultaneously performing a step C1 of supplying the $SiCl_4$ gas to the wafer 200 and a step C2 of supplying the $NH_3$ gas to the wafer 200 is performed a predetermined number of times (n times, n being an integer of 1 or more).

In the present disclosure, for the sake of convenience, the above-described processing sequence may be denoted as follows. The same denotation may be used in modifications to be described later.

$SiH_3R \rightarrow F_2 \rightarrow (SiCl_4 \rightarrow NH_3) \times n \Rightarrow SiN$ When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer". When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

When the boat 217 is charged with a plurality of wafers 200 (wafer charging), the shutter 219s is moved by the shutter opening/closing mechanism 115s and the lower end opening of the manifold 209 is opened (shutter open). Thereafter, as illustrated in FIG. 1, the boat 217 charged with the wafers 200 is lifted up by the boat elevator 115 to be loaded into the process chamber 201 (boat loading). In this state, the seal cap 219 seals the lower end of the manifold 209 through the O-ring 220b.

Figure 5A:
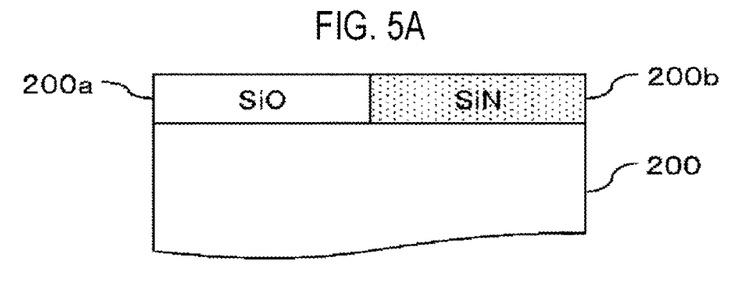
FIG. 5A is a partially-enlarged cross-sectional view of a surface of a wafer 200 on which a base 200a including a silicon oxide film and a base 200b including a silicon nitride film are exposed respectively.

As illustrated in FIG. 5A, a plurality of types of bases, here, for example, a base 200a including an oxygen (O)-containing film, specifically, an SiO film as an oxide film, and a base 200b including an O-free film, specifically, an SiN film as a nitride film, which is a non-oxide film, are in an exposed state in advance on the surface of the wafer 200. The base 200a has a hydroxyl group (OH)-terminated surface over the entire area (entire surface). The base 200b has a surface in which many areas are not OH-terminated, that is, a surface in which some areas are OH-terminated.

(Pressure Adjustment and Temperature Adjustment)

The interior of the process chamber 201, that is, a space where the wafer 200 is placed, is vacuum-exhausted (decompression-exhausted) by the vacuum pump 246 to reach a desired pressure (vacuum degree). At this time, the internal pressure of the process chamber 201 is measured by the pressure sensor 245, and the APC valve 244 is feedback-controlled based on the measured pressure information. Further, the wafer 200 in the process chamber 201 is heated by the heater 207 so as to have a desired processing temperature. At this time, the state of supplying electric power to the heater 207 is feedback-controlled based on the temperature information detected by the temperature sensor 263 so that the interior of the process chamber 201 has a desired temperature distribution. Further, the rotation of the boat 217 by the rotation mechanism 267 is started. The exhaust of the interior of the process chamber 201 and the heating and rotation of the wafer 200 are continuously performed at least until the processing on the wafer 200 is completed.

(Selective Growth)

Thereafter, the following steps A to C are sequentially executed.

[Step A]

In this step, a $SiH_3R$ gas is supplied to the wafer 200 in the process chamber 201, that is, the wafer 200 having the base 200a and the base 200b exposed on the surface thereof.

Specifically, the valve 243g is opened, and the $SiH_3R$ gas is flown into the gas supply pipe 232g. The flow rate of the $SiH_3R$ gas is adjusted by the MFC 241g, and the $SiH_3R$ gas is supplied into the process chamber 201 via the gas supply pipe 232c and the nozzle 249c and is exhausted through the exhaust port 231a. In this operation, the $SiH_3R$ gas is supplied to the wafer 200 ($SiH_3R$ gas supply). At this time, the valves 243d and 243e are opened, and an $N_2$ gas is supplied into the process chamber 201 via the nozzles 249a and 249b. The supply of the $N_2$ gas may not be performed.

Process conditions in this step are exemplified as follows.
$SiH_3R$ gas supply flow rate: 1 to 2,000 sccm, specifically 1 to 500 sccm
$SiH_3R$ gas supply time: 1 second to 60 minutes N₂ gas supply flow rate (for each gas supply pipe): 0 to 10,000 sccm Processing temperature: room temperature (25 degrees C.) to 600 degrees C. specifically room temperature to 450 degrees C.

Processing pressure: 1 to 2,000 Pa, specifically 1 to 1,000 Pa

The conditions described here are the conditions under which the SiH₃R gas does not undergo gas phase decomposition (thermal decomposition) in the process chamber 201.

In the present disclosure, the notation of a numerical range such as "1 to 2,000 Pa" means that the lower limit value and the upper limit value are included in the range. For example, "1 to 2,000 Pa" means "equal to or larger than 1 Pa and equal to or smaller than 2,000 Pa." The same applies to other numerical ranges.

Figure 5B:
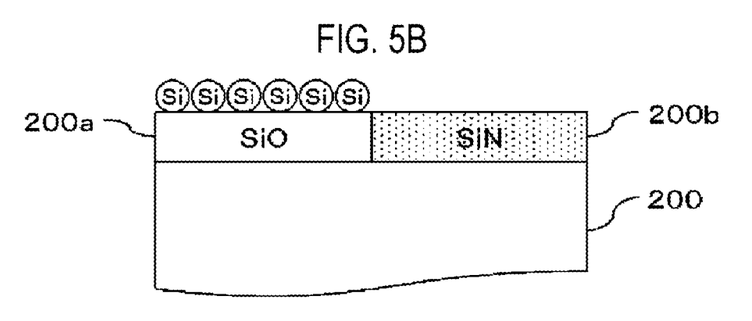
FIG. 5B is a partially-enlarged cross-sectional view of the surface of the wafer 200 after silicon is selectively adsorbed on a surface of the base 200a by supplying an aminosilane-based gas.

By supplying the SiH₃R gas to the wafer 200 under the aforementioned conditions, as illustrated in FIG. 5B, while suppressing adsorption of Si contained in the SiH₃R gas on the surface of the base 200b, it becomes possible to selectively (preferentially) adsorb Si contained in the SiH₃R gas on the surface of the base 200a. At this time, Si contained in the SiH₃R gas may be adsorbed on a portion of the surface of the base 200b, but an amount of adsorption is smaller than an amount of adsorption of Si on the surface of the base 200a. Such selective (preferential) adsorption is possible because the process conditions in this step are such that the SiH₃R gas does not undergo gas phase decomposition in the process chamber 201. In addition, this selective adsorption is possible because many areas of the surface of the base 200b are not OH-terminated (some areas of the surface are OH-terminated), whereas the surface of the base 200a is OH-terminated over the entire area. In this step, since the SiH₃R gas does not undergo gas phase decomposition in the process chamber 201, the Si contained in the SiH₃R does not multiplicatively deposit on the surfaces of the bases 200a and 200b. In this step, the OH termination formed over the entire area of the surface of the base 200a reacts with SiH₃R on the surface of the base 200a, and the Si contained in the SiH₃R is chemically adsorbed on the entire area of the surface of the base 200a. In contrast, since OH termination does not exist in many areas of the surface of the base 200b, the Si contained in SiH₃R is not chemically adsorbed on the many areas. However, the OH termination formed in some areas of the surface of the base 200b may react with SiH₃R, and the Si contained in the SiH₃R may be chemically adsorbed on the some areas. Further, when the Si contained in SiH₃R is chemically adsorbed on the surface of the base, it is chemically adsorbed in a state where H is bonded to Si.

When the supply of the SiH₃R gas is continued for a predetermined time, the chemical adsorption of Si on the surface of the base 200a is saturated. That is, the chemical adsorption of Si on the surface of the base 200a is self-limited. That is, when one Si layer is formed on the surface of the base 200a, Si is no longer chemically adsorbed on the surface of the base 200a. As a result, the amount of Si adsorbed on the surface of the base 200a is substantially uniform over the entire area of the surface of the base 200a.

After Si is selectively adsorbed on the surface of the base 200a, the valve 243g is closed, and the supply of the SiH₃R gas into the process chamber 201 is stopped. Then, the interior of the process chamber 201 is vacuum-exhausted to remove gases and the like remaining in the process chamber 201 from the interior of the process chamber 201. At this time, the valves 243d to 243f are opened, and an N₂ gas is supplied into the process chamber 201 via the nozzles 249a to 249c. The N₂ gas supplied from the nozzles 249a to 249c acts as a purge gas, whereby the interior of the process chamber 201 is purged (purge).

Examples of the aminosilane-based gas may include a diaminosilane (SiH₂RR') gas containing two amino groups in one molecule, and a triaminosilane (SiHRR'R") gas containing three amino groups in one molecule, in addition to the above-mentioned monoaminosilane gas containing only one amino group in one molecule.

In addition, an aminosilane compound represented by the following general formula [1] can be used as the aminosilane-based gas.

$$SiA_x[(NB_2)_{(4-x)}] \quad [1]$$

In the formula [1], "A" represents a hydrogen atom, an alkyl group such as a methyl group, an ethyl group, a propyl group, a butyl group or the like, or an alkoxy group such as a methoxy group, an ethoxy group, a propoxy group, a butoxy group or the like. The alkyl group may be not only a linear alkyl group but also a branched alkyl group such as an isopropyl group, an isobutyl group, a secondary butyl group, a tertiary butyl group or the like. The alkoxy group may be not only a linear alkoxy group but also a branched alkoxy group such as an isopropoxy group, an isobutoxy group or the like. "B" represents a hydrogen atom or an alkyl group such as a methyl group, an ethyl group, a propyl group, a butyl group or the like. The alkyl group may be not only a linear alkyl group but also a branched alkyl group such as an isopropyl group, an isobutyl group, a secondary butyl group, a tertiary butyl group or the like. A plurality of As may be the same or different, and two Bs may be the same or different. "x" is an integer of 1 to 3.

As the inert gas, in addition to the N₂ gas, it may be possible to use, e.g., a rare gas such as an Ar gas, a He gas, a Ne gas, a Xe gas or the like. The same applies to each step which will be described later.

[Step B]

After step A is completed, an F₂ gas is supplied to the wafer 200 in the process chamber 201, that is, the wafer 200 with Si selectively adsorbed on the surface of the base 200a.

Specifically, the valve 243b is opened, and the F₂ gas is flown into the gas supply pipe 232b. The flow rate of the F₂ gas is adjusted by the MFC 241b, and the F₂ gas is supplied into the process chamber 201 via the nozzle 249b and is exhausted through the exhaust port 231a. In this operation, the F₂ gas is supplied to the wafer 200 (F₂ gas supply). At this time, the valves 243d and 243f are opened, and a N₂ gas is supplied into the process chamber 201 via the nozzles 249a and 249c. The supply of the N₂ gas may not be performed.

Process conditions in this step are exemplified as follows.

F₂ gas supply flow rate: 1 to 2,000 sccm, specifically 1 to 500 sccm

F₂ gas supply time: 1 second to 60 minutes

Processing temperature: room temperature to 550 degrees C., specifically room temperature to 450 degrees C.

Other conditions are the same as the process conditions in step A. The conditions described here are the conditions under which the surface of the base 200a is not etched, and the conditions under which the surface of the base 200a is modified (F-terminated), as will be described later.

By supplying the F₂ gas to the wafer 200 under the aforementioned conditions, it becomes possible to react the Si adsorbed on the surface of the base 200a with the F₂ gas to thereby modify the surface of the base 200a without etching. The modified base 200a has an F-terminated (SiF-terminated) surface. When attention is paid to atoms existing on the outermost surface of the modified base 200a, the base 200a can be said to have an F-terminated surface. In addition, when attention is paid to the atoms existing on the outermost surface of the modified base 200a and atoms bonded to the existing atoms, the base 200a can be said to have a SiF-terminated surface. In the present disclosure, the former is mainly used for the sake of convenience. As the surface of the base 200a is F-terminated, a film-forming reaction does not progress on the surface of the base 200a in step C to be described later. To be precise, it is possible to lengthen a time until the film-forming reaction occurs, that is, an incubation time. If an organic component contained in the SiH$_3$R remains on the surface of the base 200a, the organic component will be removed from the surface of the base 200a when the Si adsorbed on the surface of the base 200a reacts with the F$_2$ gas.

Figure 5C:
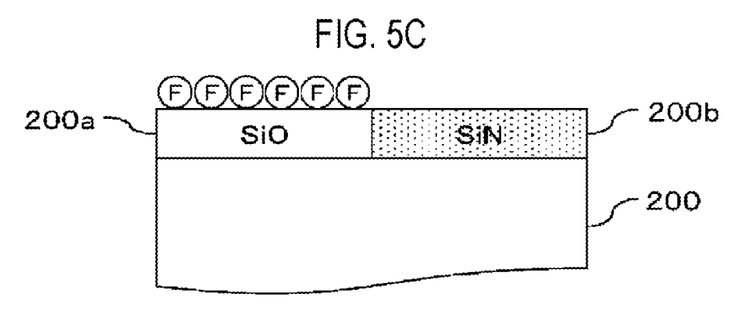
FIG. 5C is a partially-enlarged cross-sectional view of the surface of the wafer 200 after the surface of the base 200a on which silicon has been adsorbed is selectively modified by supplying a fluorine-containing gas.

As illustrated in FIG. 5C, in this step, it is possible to selectively (preferentially) modify the surface of the base 200a while suppressing the surface of the base 200b from being modified. At this time, a portion of the surface of the base 200b may be modified, but an amount of the modification of the surface of the base 200b is smaller than an amount of the modification of the surface of the base 200a. Such selective (preferential) modification is possible because, after performing step A, Si is adsorbed on the entire area of the surface of the base 200a, whereas Si is not adsorbed on many areas of the surface of the base 200b. Since Si is not adsorbed on many areas of the surface of the base 200b, a reaction between Si and F$_2$ does not progress, and as a result, F-termination is not formed in the many regions. However, as described above, Si may be adsorbed on some areas of the surface of the base 200b, in which case F-termination may be formed in the some areas. In contrast, the Si adsorbed on the surface of the base 200a reacts with F$_2$ over the entire area of the surface of the base 200a to thereby generate F-containing radicals, and very stable F-termination (SiF-termination) is formed on the entire area of the surface of the base 200a by action of these radicals. Examples of the F-containing radicals may include F, SiF, SiF$_2$, SiF$_3$, SiHF, SiH$_2$F, SiHF$_2$ and the like.

In addition, as described above, the amount of Si adsorbed on the base 200a in step A is substantially uniform over the entire area of the surface of the base 200a. Therefore, in this step, the amount of F-containing radicals generated on the surface of the base 200a is substantially uniform over the entire area of the surface. As a result, the above-described modification of the base 200a progresses substantially uniformly over the entire area of the surface.

Further, as described above, since Si is not adsorbed on many areas of the surface of the base 200b, a reaction between Si and F$_2$ does not progress and no F-containing radical is generated, thereby preventing the many areas from being modified. However, when Si is adsorbed on the some areas of the surface of the base 200b, the Si reacts with F$_2$ in the some areas to thereby generate F-containing radicals to modify the some areas, as described above. As a result, the surface of the base 200b is hardly damaged by etching, and adsorption sites are maintained in many areas of the surface.

After the surface of the base 200a of the bases 200a and 200b is selectively modified, the valve 243b is closed and the supply of the F$_2$ gas into the process chamber 201 is stopped. Then, gases and the like remaining in the process chamber 201 are removed from the interior of the process chamber 201 by the same processing sequence as the purge in step A.

As the fluorine-containing gas, in addition to the F$_2$ gas, it may be possible to use, e.g., a chlorine trifluoride (ClF$_3$) gas, a chlorine fluoride gas (ClF) gas, an F$_2$+nitrogen oxide (NO) gas, a ClF+NO gas, a nitrogen trifluoride (NF$_3$) gas, a tungsten hexafluoride (WF$_6$) gas, a nitrosyl fluoride (FNO) gas, or a mixed gas thereof.

(Step C)

In this step, steps C1 and C2 are sequentially executed.

[Step C1]

In this step, a SiCl$_4$ gas is supplied to the wafer 200 in the process chamber 201, that is, the wafer 200 in which the surface of the base 200a of the bases 200a and 200b has been selectively modified.

Specifically, the valve 243a is opened, and the SiCl$_4$ gas is flown into the gas supply pipe 232a. The flow rate of the SiCl$_4$ gas is adjusted by the MFC 241a, and the SiCl$_4$ gas is supplied into the process chamber 201 via the nozzle 249a and is exhausted through the exhaust port 231a. In this operation, the SiCl$_4$ gas is supplied to the wafer 200 (SiCl$_4$ gas supply). At this time, the valves 243e and 243f may be opened to supply an N$_2$ gas into the process chamber 201 via the nozzles 249b and 249c.

Process condition in this step are exemplified as follows.

SiCl$_4$ gas supply flow rate: 1 to 2,000 sccm, specifically 1 to 1,000 sccm

SiCl$_4$ gas supply time: 1 to 180 seconds, specifically 10 to 120 seconds

Processing temperature: 350 to 600 degrees C., specifically 400 to 550 degrees C.

Processing pressure: 1 to 2,000 Pa, specifically 10 to 1,333 Pa

Other process conditions are the same as the process conditions in step A.

By supplying the SiCl$_4$ gas to the wafer 200 under the aforementioned conditions, a Si-containing layer containing Cl is formed on the surface of the base 200b including an unmodified area of the bases 200a and 200b. That is, a Si-containing layer containing Cl is formed starting from an area of the base 200b that has not been modified, that is, an area where the adsorption site is maintained. The Si-containing layer containing Cl is formed by physical adsorption of SiCl$_4$, chemical adsorption of a substance (SiClx) in which a portion of SiCl$_4$ is decomposed, deposition of Si by thermal decomposition of SiCl$_4$, and the like on the surface of the base 200b. The Si-containing layer containing Cl may be an adsorption layer (physical adsorption layer or chemical adsorption layer) of SiCl$_4$ or SiClx, or may be a deposition layer of Si containing Cl. In the present disclosure, the Si-containing layer containing Cl is also simply referred to as a Si-containing layer.

In this step, it is possible to selectively form a Si-containing layer on the surface of the base 200b while suppressing formation of the Si-containing layer on the surface of the base 200a. In some cases, for example, when the surface of the base 200a is insufficiently modified for some reason, a very small amount of Si-containing layer may be formed on the surface of the base 200a. However, even in such cases, the thickness of the Si-containing layer formed on the surface of the base 200a is much smaller than the thickness of the Si-containing layer formed on the surface of the base 200b. Such selective formation of the Si-containing layer is attributable to the fact that the F-termination existing on the surface of the base 200a acts as a factor that inhibits the formation of the Si-containing layer (the adsorption of Si) on the surface of the base 200a, that is, an inhibitor. In addition, the F-termination existing on the surface of the base 200a is stably maintained without disappearing even when performing this step.

After the Si-containing layer is formed on the surface of the base 200b, the valve 243a is closed, and the supply of the SiCl$_4$ gas into the process chamber 201 is stopped. Then, gases and the like remaining in the process chamber 201 are removed from the interior of the process chamber 201 by the same processing sequence as the purge in step A (purge).

As the precursor gas (film-forming gas), in addition to the SiCl$_4$ gas, it may be possible to use, e.g., a chlorosilane-based gas such as a monochlorosilane (SiH$_3$Cl, abbreviation: MCS) gas, a dichlorosilane (SiH$_2$Cl$_2$, abbreviation: DCS) gas, a trichlorosilane (SiHCl$_3$, abbreviation: TCS) gas, a hexachlorodisilane (Si$_2$Cl$_6$, abbreviation: HCDS) gas, an octachlorotrisilane (Si$_3$Cl$_8$, abbreviation: OCTS) gas or the like, a bromosilane-based gas such as a tetrabromosilane (SiBr$_4$) gas, or an iodosilane-based gas such as a tetraiodosilane (SiI$_4$) gas or the like.

[Step C2]

In this step, an NH$_3$ gas is supplied to the wafer 200 in the process chamber 201, specifically, the Si-containing layer formed on the base 200b.

Specifically, the valve 243c is opened, and the NH$_3$ gas is flown into the gas supply pipe 232c. The flow rate of the NH$_3$ gas is adjusted by the MFC 241c, and the NH$_3$ gas is supplied into the process chamber 201 via the nozzle 249c and is exhausted through the exhaust port 231a. In this operation, the NH$_3$ gas is supplied to the wafer 200 (NH$_3$ gas supply). At this time, the valves 243d and 243e may be opened to supply a N$_2$ gas into the process chamber 201 via the nozzles 249a and 249b.

Process conditions in this step are exemplified as follows.
NH$_3$ gas supply flow rate: 10 to 10,000 sccm
NH$_3$ gas supply time: 1 to 60 seconds, specifically 5 to 50 seconds
Processing pressure: 1 to 4,000 Pa, specifically 1 to 1,333 Pa
Other process conditions are the same as the process conditions in step A.

By supplying the NH$_3$ gas to the wafer 200 under the aforementioned conditions, at least a portion of the Si-containing layer formed on the surface of the base 200b is nitrided (modified). As the Si-containing layer is modified, a layer containing Si and N, that is, a silicon nitride layer (SiN layer), is formed on the surface of the base 200b. When the SiN layer is formed, impurities such as Cl or the like contained in the Si-containing layer constitute a gaseous substance containing at least Cl in the process of modifying the Si-containing layer by the NH$_3$ gas and are discharged from the interior of the process chamber 201. As a result, the SiN layer becomes a layer having fewer impurities such as Cl than the Si-containing layer formed in step C1. The surface of the base 200a is maintained without being modified even when this step is performed. That is, the surface of the base 200a is stably maintained at F-termination without being modified (NH-terminated).

After the SiN layer is formed on the surface of the base 200b, the valve 243c is closed, and the supply of the NH$_3$ gas into the process chamber 201 is stopped. Then, gases and the like remaining in the process chamber 201 are removed from the interior of the process chamber 201 by the same processing sequence as the purge in step A (purge).

As the reaction gas (film-forming gas), in addition to the NH$_3$ gas, it may be possible to use, e.g., a hydrogen nitride-based gas such as a diazene (N$_2$H$_2$) gas, a hydrazine (N$_2$H$_4$) gas, an N$_3$H$_8$ or the like.

(Performing Predetermined Number of Times)

Figure 5D:
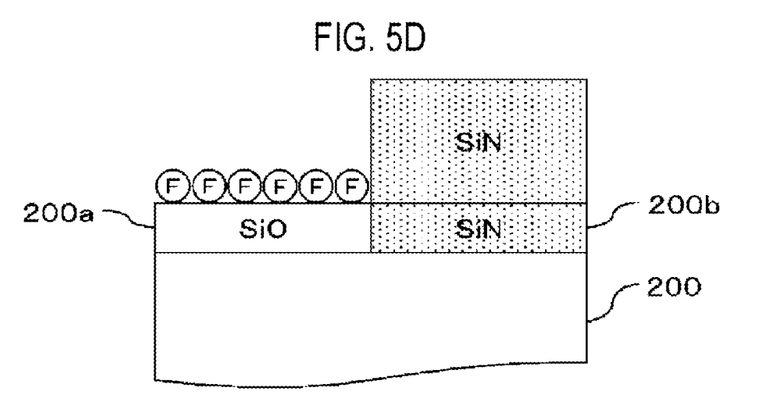
FIG. 5D is a partially-enlarged sectional view of the surface of the wafer 200 after a silicon nitride film is selectively formed on the surface of the base 200b.

When a cycle that non-simultaneously (i.e., asynchronously) performs the above-described steps C1 and C2 is performed a predetermined number of times (n times, n being an integer of 1 or more), a SiN film can be selectively formed on the surface of the base 200b of the bases 200a and 200b exposed on the surface of the wafer 200, as illustrated in FIG. 5D. This cycle may be repeated multiple times. That is, the thickness of the SiN layer formed per one cycle may be set to be smaller than a desired film thickness. Thus, the above cycle may be repeated multiple times until the film thickness of a film formed by laminating the SiN layers becomes equal to the desired film thickness.

When steps C1 and C2 are performed, since the F-termination existing on the surface of the base 200a is maintained without disappearing, no SiN film is formed on the surface of the base 200a. However, in some cases, when the surface of the base 200a is insufficiently modified for some reason, a very small amount of SiN film may be formed on the surface of the base 200a. However, even in such cases, the thickness of the SiN film formed on the surface of the base 200a is much smaller than the thickness of the SiN film formed on the surface of the base 200b. In the present disclosure, "selectively forming a SiN film on the surface of the base 200b" of the bases 200a and 200b is meant to include not only a case where no SiN film is formed on the surface of the base 200a, but also a case where an extremely thin SiN film is formed on the surface of the base 200a, as described above.

(After-Purging and Returning to Atmospheric Pressure)

After the selective formation of the SiN film on the base 200b is completed, a N$_2$ gas as a purge gas is supplied into the process chamber 201 from each of the nozzles 249a to 249c and is exhausted through the exhaust port 231a. Thus, the interior of the process chamber 201 is purged and the residual gas and the reaction byproducts remaining in the process chamber 201 are removed from the interior of the process chamber 201 (after-purging). Thereafter, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

The seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved, and the lower end opening of the manifold 209 is sealed by the shutter 219s through the O-ring 220c (shutter closing). After being unloaded from the reaction tube 203, the processed wafers 200 are discharged from the boat 217 (wafer discharging).

Figure 5E:
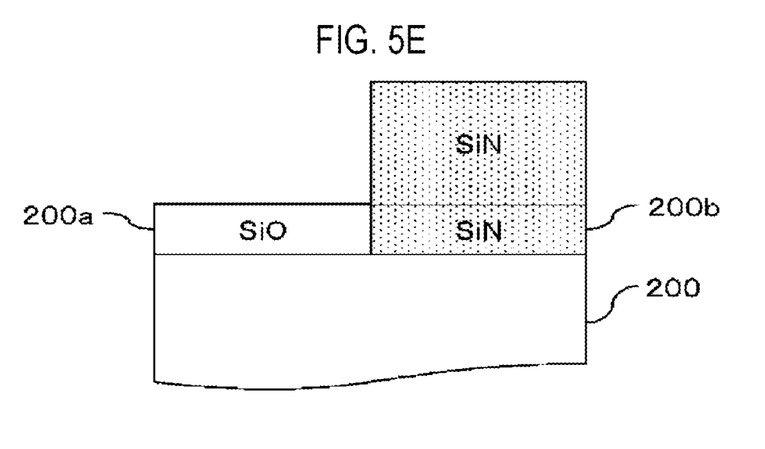
FIG. 5E is a partially-enlarged sectional view of the surface of the wafer 200 after the wafer 200 illustrated in FIG. 5D is exposed to the atmosphere.

As illustrated in FIG. 5E, the F-termination existing on the surface of the base 200a disappears by reaction with a predetermined reactant, specifically, moisture (H$_2$O) in the atmosphere when the processed wafers 200 are exposed to the atmosphere. That is, by exposing the processed wafers 200 to the atmosphere, the F-termination existing on the surface of the base 200a can be removed. By removing the F-termination from the surface of the base 200a, the surface state of the base 200a is reset, and a film-forming process on the surface of the base 200a can be progressed in a subsequent step.

(3) Effects of the Present Embodiment

According to the present embodiment, one or more effects set forth below may be achieved.

(a) By performing steps A to C, it is possible to selectively form a SiN film on the surface of the base 200b of the bases 200a and 200b exposed on the surface of the wafer 200. This makes it possible to simplify processes of manufacturing a semiconductor device, such as omitting a patterning process including photolithography. As a result, it is possible to improve the productivity of semiconductor devices and reduce the manufacturing costs.

(b) In step A, the amount of Si selectively (preferentially) adsorbed on the base 200a can be made substantially uniform over the entire area of the surface of the base 200a. Thus, in step B, the entire area of the surface of the base 200a can be substantially uniformly modified. As a result, in step C, the formation of the SiN film on the base 200a can be substantially uniformly and reliably inhibited over the entire area of the surface. That is, it is possible to increase the selectivity in the selective growth.

(c) After step C is performed, by exposing the processed wafers 200 to the atmosphere, it is possible to eliminate the F-termination as an inhibitor existing on the surface of the base 200a. Since the F-termination can be easily removed in this manner, it is not necessary to separately provide a step of removing the inhibitor, thereby simplifying a process of manufacturing a semiconductor device, improving the productivity of semiconductor devices, and reducing the manufacturing costs.

(d) Since at least one of steps A to C, specifically each of steps A to C, is performed in a non-plasma atmosphere, plasma damage to the wafer 200 can be avoided. Therefore, the method of the present disclosure can also be applied to a process that is concerned about plasma damage.

(e) The above-described effects can be obtained similarly even when an aminosilane-based gas other than the $SiHR_3$ gas is used, when a fluorine-containing gas other than the $F_2$ gas is used, when a precursor gas other than the $SiCl_4$ gas is used, when a reaction gas other than the $NH_3$ gas is used, and/or when an inert gas other than the $N_2$ gas is used.

OTHER EMBODIMENTS OF THE PRESENT DISCLOSURE

While some embodiments of the present disclosure have been described in detail above, the present disclosure is not limited to the aforementioned embodiments but may be differently modified without departing from the subject matter of the present disclosure.

For example, in addition to the base 200a including a SiO film and the base 200b including a SiN film, a base including a conductive metal-based thin film such as a tungsten film (W film), a tungsten nitride film (WN film), a titanium nitride film (TiN film) or the like may be exposed on the surface of the wafer 200. Further, instead of the base 200b including the SiN film, a base including the above-mentioned metal-based thin film may be exposed. Even in these cases, the same effects as in the above-described embodiments can be obtained. That is, it is possible to selectively form a film on the surface of the SiN film or the surface of the above-mentioned metal-based thin film while avoiding film formation on the SiO film.

In addition, for example, in step A, as the aminosilane-based gas, a diaminosilane gas or a triaminosilane gas may be used instead of the monoaminosilane gas. Even in this case, the same effects as in the above-described embodiments can be obtained. However, in step A, as a gas having fewer amino groups included in one molecule is used as the aminosilane-based gas, the adsorption density of Si on the surface of the base 200a increases, and in step B, the density of the SiF-termination formed on the surface of the base 200a increases. As a result, in step C, the effect of inhibiting film formation on the surface of the base 200a can be enhanced. In this regard, monoaminosilane having one amino group in one molecule as the aminosilane-based gas may be used in some embodiments.

Further, for example, in step C, before the cycle that non-simultaneously performs steps C1 and C2 is started, a step ($NH_3$ pre-flow) of supplying an $NH_3$ gas to the wafer 200 in the process chamber 201, that is, the wafer 200 in which the surface of the base 200a of the bases 200a and 200b has been selectively modified, may be performed for a predetermined time. Even in this case, since the F-termination existing on the surface of the base 200a is stably maintained without disappearing, the same effects as in the above-described embodiments can be obtained. Further, the adsorption sites on the surface of the base 200b can be optimized so that the quality of the SiN film formed on the base 200b can be improved.

Further, for example, in step C, as the precursor gas, in addition to the $SiCl_4$ gas, it may be possible to use, e.g., the above-mentioned chlorosilane-based gas or a metal halide gas such as a titanium tetrachloride ($TiCl_4$) gas. Further, for example, as the reaction gas, in addition to the N-containing gas such as the $NH_3$ gas, it may be possible to use, e.g., an O-containing gas such as an oxygen ($O_2$) gas, an N- and C-containing gas such as a triethylamine (($C_2H_5)_3N$, abbreviation: TEA) gas, a C-containing gas such as a propylene ($C_3H_6$) gas or a boron (B)-containing gas such as a trichloroborane ($BCl_3$) gas. Then, a film such as a silicon oxynitride film (SiON film), a silicon carbonitride film (SiCN film), a silicon oxycarbonitride film (SiOCN film), a silicon oxycarbide film (SiOC film), a silicon boronitride film (SiBN film), a silicon borocarbonitride film (SiBCN film), a titanium nitride film (TiN film), a titanium oxynitride film (TiON film) or the like may be formed on the unmodified surface of the base 200b of the bases 200a and 200b according to the following gas supply sequences. Since the F-termination formed on the surface of the base 200a is very stable, in this case, that is, when a gas containing an OH group such as water vapor ($H_2O$ gas) is not used as a film-forming gas, the same effects as in the above-described embodiments are obtained.

Recipes used in each process may be provided individually according to the processing contents and may be stored in the memory device 121c via a telecommunication line or the external memory device 123. Moreover, at the beginning of each process, the CPU 121a may properly select an appropriate recipe from the recipes stored in the memory device 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start the substrate processing while avoiding an operation error.

The recipes mentioned above are not limited to newly-prepared ones but may be provided, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed using a batch-type substrate processing apparatus capable of processing a plurality of substrates at a time has been described in the above embodiments. The present disclosure is not limited to the above embodiments but may be suitably applied, for example, to a case where films are formed using a single-wafer-type substrate processing apparatus capable of processing a single substrate or several substrates at a time. In addition, the example in which films are formed using a substrate processing apparatus provided with a hot-wall-type process furnace has been described in the above embodiments. The present disclosure is not limited to the above embodiments but may be suitably applied to a case where films are formed using a substrate processing apparatus provided with a cold-wall-type process furnace.

In the case of using these substrate processing apparatuses, each process may be performed according to the same process procedures and process conditions as those in the above embodiments and modifications, and the same effects as those of the above embodiments can be achieved.

The above embodiments may be used in proper combination. The process procedures and process conditions used in this case may be the same as those of the above embodiments.

According to the present disclosure, it is possible to increase the selectivity in the above-mentioned selective growth.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) supplying a silicon- and ligand-containing gas to a substrate having a surface on which a first base and a second base are exposed to thereby adsorb silicon contained in the silicon- and ligand-containing gas on a surface of one of the first base and the second base;
   (b) supplying a fluorine-containing gas to the substrate after the silicon is adsorbed on the surface of the one of the first base and the second base, to thereby cause the silicon adsorbed on the surface of the one of the first base and the second base to react with the fluorine-containing gas to modify the surface of the one of the first base and the second base to be F-terminated; and
   (c) supplying a film-forming gas to the substrate after the surface of the one of the first base and the second base is modified, to thereby form a film on a surface of the other of the first base and the second base, which is different from the one of the first base and the second base.

2. The method of claim 1, wherein (a) is performed under a condition in which the adsorption of the silicon on the surface of the one of the first base and the second base is self-limited.

3. The method of claim 1, wherein (a) is performed under a condition that the silicon- and ligand-containing gas does not undergo gas phase decomposition.

4. The method of claim 1, wherein (a) is performed under a condition that the silicon contained in the silicon- and ligand-containing gas is chemically adsorbed on the surface of the one of the first base and the second base.

5. The method of claim 1, wherein in (a), the silicon contained in the silicon- and ligand-containing gas is adsorbed on the surface of the one of the first base and the second base while suppressing adsorption of the silicon on the surface of the other of the first base and the second base.

6. The method of claim 1, wherein the one of the first base and the second base before supplying the silicon- and ligand-containing gas has a hydroxyl group-terminated surface, and the other of the first base and the second base before supplying the silicon- and ligand-containing gas has a non-hydroxyl group-terminated surface.

7. The method of claim 1, wherein ligand in the silicon- and ligand-containing gas is an amino group.

8. The method of claim 1, wherein the silicon- and ligand-containing gas is an aminosilane-based gas.

9. The method of claim 1, wherein the silicon- and ligand-containing gas is an aminosilane-based gas containing one amino group in one molecule.

10. The method of claim 1, wherein the silicon- and ligand-containing gas is a monoaminosilane gas.

11. The method of claim 1, wherein in (b), the surface of the one of the first base and the second base is modified without being etched.

12. The method of claim 1, wherein in (b), the surface of the one of the first base and the second base is modified while suppressing the surface of the other of the first base and the second base from being modified.

13. The method of claim 1, wherein in (c), the film is formed on the surface of the other of the first base and the second base without forming the film on the surface of the one of the first base and the second base.

14. The method of claim 1, wherein the first base includes an oxygen-containing film, and the second base includes an oxygen-free film.

15. The method of claim 1, wherein the first base includes an oxide film, and the second base includes a nitride film.

16. The method of claim 1, wherein the first base includes a film containing silicon and oxygen, and the second base includes a film containing silicon and nitrogen.

17. The method of claim 1, wherein the one of the first base and the second base is the first base, and the other of the first base and the second base is the second base.

18. The method of claim 1, wherein at least one selected from the group of (a), (b) and (c) is performed in a non-plasma atmosphere.

19. The method of claim 1, wherein after performing (c), the F-termination is removed from the surface of the one of the first base and the second base.

20. A substrate processing method, comprising:
  (a) supplying a silicon- and ligand-containing gas to a substrate having a surface on which a first base and a second base are exposed to thereby adsorb silicon contained in the silicon- and ligand-containing gas on a surface of one of the first base and the second base;
  (b) supplying a fluorine-containing gas to the substrate after the silicon is adsorbed on the surface of the one of the first base and the second base, to thereby cause the silicon adsorbed on the surface of the one of the first base and the second base to react with the fluorine-containing gas to modify the surface of the one of the first base and the second base to be F-terminated; and
  (c) supplying a film-forming gas to the substrate after the surface of the one of the first base and the second base is modified, to thereby form a film on a surface of the other of the first base and the second base, which is different from the one of the first base and the second base.

21. A substrate processing apparatus comprising:
  a process chamber in which a substrate having a surface on which a first base and a second base are exposed is processed;
  a silicon- and ligand-containing gas supply system configured to supply a silicon- and ligand-containing gas to the substrate in the process chamber;
  a fluorine-containing gas supply system configured to supply a fluorine-containing gas to the substrate in the process chamber;
  a film-forming gas supply system configured to supply a film-forming gas to the substrate in the process chamber; and
  a controller configured to be capable of controlling the silicon- and ligand-containing gas supply system, the fluorine-containing gas supply system, and the film-forming gas supply system to perform a process in the process chamber, the process including:
    (a) supplying the silicon- and ligand-containing gas to the substrate, to thereby adsorb silicon contained in the silicon- and ligand-containing gas on a surface of one of the first base and the second base;
    (b) supplying the fluorine-containing gas to the substrate after the silicon is adsorbed on the surface of the one of the first base and the second base, to thereby cause the silicon adsorbed on the surface of the one of the first base and the second base to react with the fluorine-containing gas to modify the surface of the one of the first base and the second base to be F-terminated; and
    (c) supplying the film-forming gas to the substrate after the surface of the one of the first base and the second base is modified, to thereby form a film on a surface of the other of the first base and the second base, which is different from the one of the first base and the second base.

22. A non-transitory computer-readable recording medium storing a program that causes, by a computer, a substrate processing apparatus to perform a process in a process chamber of the substrate processing apparatus, the process comprising:
  (a) supplying a silicon- and ligand-containing gas to a substrate having a surface on which a first base and a second base are exposed, to thereby adsorb silicon contained in the silicon- and ligand-containing gas on a surface of one of the first base and the second base;
  (b) supplying a fluorine-containing gas to the substrate after the silicon is adsorbed on the surface of the one of the first base and the second base, to thereby cause the silicon adsorbed on the surface of the one of the first base and the second base to react with the fluorine-containing gas to modify the surface of the one of the first base and the second base to be F-terminated; and
  (c) supplying a film-forming gas to the substrate after the surface of the one of the first base and the second base is modified, to thereby form a film on a surface of the other of the first base and the second base, which is different from the one of the first base and the second base.

* * * * *